United States Patent
Martin et al.

(10) Patent No.: US 6,498,112 B1
(45) Date of Patent: Dec. 24, 2002

(54) GRADED OXIDE CAPS ON LOW DIELECTRIC CONSTANT (LOW K) CHEMICAL VAPOR DEPOSITION (CVD) FILMS

(75) Inventors: Jeremy I. Martin, Austin, TX (US); Ting Yiu Tsui, Dallas, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/904,943

(22) Filed: Jul. 13, 2001

(51) Int. Cl.[7] .................... H01L 21/31; H01L 21/469
(52) U.S. Cl. .................. 438/763; 438/761; 438/788; 438/789
(58) Field of Search ............... 438/788, 789, 438/790, 761, 763

(56) References Cited

U.S. PATENT DOCUMENTS 6,054,379 A * 4/2000 Yau et al. .................. 438/623
6,068,884 A * 5/2000 Rose et al. ................ 427/255.6

OTHER PUBLICATIONS

Loboda, M.J., Seifferly, J. A., Grove, C.M. and Schneider R.F.; *Safe Precursor Gas for Broad Replacement of SiH4 in Plasma Processes Employed in Integrated Circuit Production*, 1997, Title and pp 146–150.

Loboda, M.J., Seifferly, J. A., Grove, C.M. and Schneider R.F.; *Using Trimethylsilane to Improve Safety, Throughput and Versatility in PECVD Processes*, 1997, 12 pages.

* cited by examiner

Primary Examiner—Alexander Ghyka
(74) Attorney, Agent, or Firm—Williams, Morgan & Amerson (57) ABSTRACT

A method is provided, the method comprising forming a first dielectric layer above a structure layer, the first dielectric layer having an upper portion. The method also comprises grading the upper portion of the first dielectric layer using at least one of monomethyl silane, dimethyl silane, trimethyl silane, and tetramethyl silane with helium (He) and at least one of nitrous oxide ($N_2O$) and molecular nitrogen ($O_2$).

16 Claims, 6 Drawing Sheets

GRADED OXIDE CAPS ON LOW DIELECTRIC CONSTANT (LOW K) CHEMICAL VAPOR DEPOSITION (CVD) FILMS

BACKGROUND OF THE INVENTION

1. Field of the Invention

This invention relates generally to semiconductor fabrication technology, and, more particularly, to techniques for filling contact openings and vias with copper and creating copper interconnections and lines.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires reducing the size and cross-sectional dimensions of electrical interconnects to contacts to active areas, such as $N^+$ ($P^+$) source/drain regions and a doped-polycrystalline silicon (doped-polysilicon or doped-poly) gate conductor, and the like. As the size and cross-sectional dimensions of electrical interconnects get smaller, resistance increases and electromigration increases. Increased resistance and electromigration are undesirable for a number of reasons. For example, increased resistance may reduce device drive current, and source/drain current through the device, and may also adversely affect the overall speed and operation of the transistor. Additionally, electromigration effects in aluminum (Al) interconnects, where electrical currents actually carry Al atoms along with the current, causing them to electromigrate, may lead to degradation of the Al interconnects, further increased resistance, and even disconnection and/or delamination of the Al interconnects.

The ideal interconnect conductor for semiconductor circuitry will be inexpensive, easily patterned, have low resistivity, and high resistance to corrosion, electromigration, and stress migration. Aluminum (Al) is most often used for interconnects in contemporary semiconductor fabrication processes primarily because Al is inexpensive and easier to etch than, for example, copper (Cu). However, because Al has poor electromigration characteristics and high susceptibility to stress migration, it is typical to alloy Al with other metals.

As discussed above, as semiconductor device geometries shrink and clock speeds increase, it becomes increasingly desirable to reduce the resistance of the circuit metallization. The one criterion that is most seriously compromised by the use of Al for interconnects is that of conductivity. This is because the three metals with lower resistivities (Al has a resistivity of $2.824 \times 10^{-6}$ ohms-cm at 20° C.), namely, silver (Ag) with a resistivity of $1.59 \times 10^{-6}$ ohms-cm (at 20° C.), copper (Cu) with a resistivity of $1.73 \times 10^{-6}$ ohms-cm (at 20° C.), and gold (Au) with a resistivity of $2.44 \times 10^{-6}$ ohms-cm (at 20° C.), fall short in other significant criteria. Silver, for example, is relatively expensive and corrodes easily, and gold is very costly and difficult to etch. Copper, with a resistivity nearly on par with silver, immunity from electromigration, high ductility (which provides high immunity to mechanical stresses generated by differential expansion rates of dissimilar materials in a semiconductor chip) and high melting point (1083° C. for Cu vs. 660° C. for Al), fills most criteria admirably. However, Cu is difficult to etch in a semiconductor environment. As a result of the difficulty in etching Cu, an alternative approach to forming vias and metal lines must be used. The damascene approach, consisting of etching openings such as trenches in the dielectric for lines and vias and creating in-laid metal patterns, is the leading contender for fabrication of sub-0.25 micron (sub-$0.25\mu$) design rule Cu-metallized circuits.

However, the lower resistance and higher conductivity of the Cu interconnects, coupled with higher device density and, hence, decreased distance between the Cu interconnects, may lead to increased capacitance between the Cu interconnects. Increased capacitance between the Cu interconnects, in turn, results in increased RC time delays and longer transient decay times in the semiconductor device circuitry, causing decreased overall operating speeds of the semiconductor devices.

One conventional solution to the problem of increased capacitance between the Cu interconnects is to use "low dielectric constant" or "low K" dielectric materials, where K is less than or equal to about 4, for the interlayer dielectric layers (ILD's) in which the Cu interconnects are formed using the damascene techniques. However, low K dielectric materials are difficult materials to use in conjunction with the damascene techniques. For example, some low K dielectric materials are susceptible to being damaged and weakened during the etching and subsequent processing steps used in the damascene techniques. In particular, the sidewalls of openings such as trenches and/or vias formed in low K dielectric materials are especially vulnerable. In addition, some low K dielectric materials, especially those with k less than or equal to about 2.5, are porous and are a weak and non-uniform substrate for the deposition of a barrier metal layer. In particular, after etching and ashing (to remove photoresist masks used for patterning), porous low K dielectric materials may have open pores (caused in part by air retained in the porous low K dielectric materials), which are undesirable in a substrate on which a barrier metal layer is to be deposited because of outgassing and surface roughness.

One or more barrier metal layers are typically used to protect material adjacent the copper (Cu) interconnects in the semiconductor devices from being poisoned by copper (Cu) atoms diffusing from the copper (Cu) interconnect into the adjacent material. For example, the barrier metal layer(s) may protect adjacent silicon-containing structures from being poisoned by copper (Cu) atoms diffusing from the copper (Cu) interconnect into the adjacent silicon-containing structures.

However, a diffusion barrier layer and/or an etch stop layer (typically silicon nitride, $Si_3N_4$, or SiN, for short, or amorphous silicon carbide, or some combination $SiC_xN_yH_z$) formed above a low K dielectric layer typically does not adhere well. The adhesion of a diffusion barrier layer and/or a nitride etch stop layer to an underlying low K dielectric layer needs to be improved. Furthermore, during the integration of plasma-enhanced chemical vapor deposition (PECVD) low K dielectric films, it is frequently desirable to cap these plasma-enhanced chemical vapor deposition (PECVD) low K dielectric films with other plasma-enhanced chemical vapor deposition (PECVD) dielectric films. However, the initiation of the cap deposition process frequently leads to one or more physical and/or chemical changes in the upper portions of the low K dielectric films. These physical and/or chemical changes in the upper portions of the low K dielectric films may adversely affect the physical properties of the interface. For example, the adhesion between the low K dielectric film and the cap layer may be decreased, the effective dielectric constant of the low K dielectric film may be increased, increasing the capacitive coupling between neighboring copper lines and hence the RC delay times in the integrated circuit, and/or a current leakage route may be established at such an interface.

The present invention is directed to overcoming, or at least reducing the effects of, one or more of the problems set forth above.

SUMMARY OF THE INVENTION

In one aspect of the present invention, a method is provided, the method comprising forming a first dielectric layer above a structure layer, the first dielectric layer having an upper portion. The method also comprises grading the upper portion of the first dielectric layer using at least one of monomethyl silane, dimethyl silane, trimethyl silane, and tetramethyl silane with helium (He) and at least one of nitrous oxide ($N_2O$) and molecular nitrogen ($O_2$).

In another aspect of the present invention, a device is provided, the device comprising a first dielectric layer above a structure layer, the first dielectric layer having an upper portion, wherein the upper portion has been graded using at least one of monomethyl silane, dimethyl silane, trimethyl silane, and tetramethyl silane with helium (He) and at least one of nitrous oxide ($N_2O$) and molecular nitrogen ($O_2$)
BRIEF

DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 1–12 schematically illustrate a process flow according to various embodiments of the present invention; and, more particularly:

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 1–12. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

Figure 1:
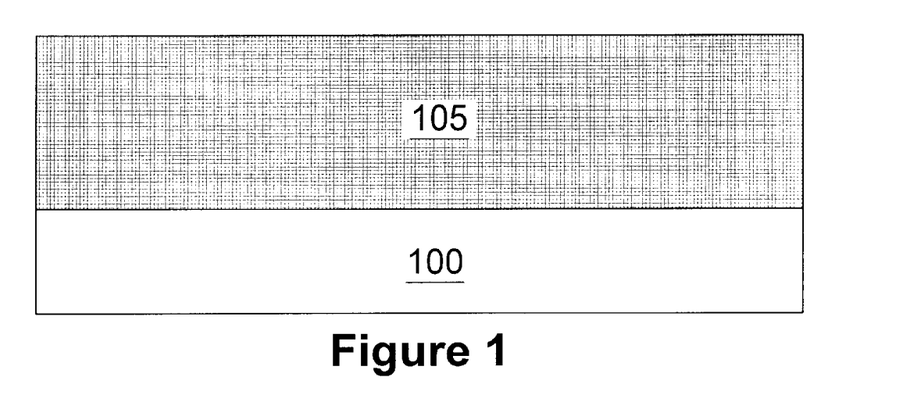
FIG. 1 schematically illustrates a first dielectric layer formed above a structure layer according to various embodiments of the present invention.

As shown in FIG. 1, a first dielectric layer 105 may be formed above a structure layer 100 such as a semiconducting substrate. However, the present invention is not limited to the formation of a portion of a copper-based interconnect above the surface of a semiconducting substrate such as a silicon wafer, for example. Rather, as will be apparent to one skilled in the art upon a complete reading of the present disclosure, a copper-based interconnect formed in accordance with the present invention may be formed above previously formed semiconductor devices and/or process layer, e.g., transistors, or other similar structure. In effect, the present invention may be used to form process layers on top of previously formed process layers. The structure layer 100 may be an underlayer of semiconducting material, such as a silicon substrate or wafer, or, alternatively, may be an underlayer of semiconductor devices, such as a layer of metal oxide semiconductor field effect transistors (MOSFETs), and the like, and/or a metal interconnection layer or layers and/or an interlayer dielectric (ILD) layer or layers, and the like.

In a damascene copper process flow, according to various embodiments of the present invention, as shown in FIGS. 1–12, the first dielectric layer 105 is formed above the structure layer 100. The first dielectric layer 105 may be formed from a variety of "low dielectric constant" or "low K" (K is less than or equal to about 4) dielectric materials. The low K first dielectric layer 105 may be formed by a variety of known techniques for forming such layers, e.g., chemical vapor deposition (CVD), low-pressure chemical vapor deposition (LPCVD), plasma-enhanced chemical vapor deposition (PECVD), spin-on glass, and the like, and may have a thickness ranging from approximately 2000 Å–10000 Å, for example.

The low K first dielectric layer 105 may be formed from a variety of low K dielectric materials, where K is less than or equal to about 4. Examples include organosilicate glass (OSG) materials such as Applied Material's Black Diamond®, Novellus' Coral®, Allied Signal's Nanoglass®, JSR's LKD, and the like. In one illustrative embodiment, the low K first dielectric layer 105 is comprised of Applied Material's Black Diamond®, having a thickness of approximately 5000 Å, formed by being blanket-deposited by a plasma-enhanced chemical vapor deposition (PECVD).

As shown in FIGS. 2–5, upper portions 210, 310, 410 and 510 of the first dielectric layer 105 may be graded using at least one of monomethyl silane ($SiH_3(CH_3)$), dimethyl silane ($SiH_2(CH_3)_2$), trimethyl silane ($SiH(CH_3)_3$), or tetramethyl silane ($Si(CH_3)_4$), respectively, with helium (He) and at least one of nitrous oxide ($N_2O$) and/or molecular oxygen ($O_2$). The grading of the upper portions 210, 310, 410 and 510 of the first dielectric layer 105 may comprise reducing the flow of the monomethyl silane ($SiH_3(CH_3)$), the dimethyl silane ($SiH_2(CH_3)_2$), the trimethyl silane ($SiH(CH_3)_3$), and/or the tetramethyl silane ($Si(CH_3)_4$), increasing the flow of the helium (He), and increasing the flow of the nitrous oxide ($N_2O$) and/or the molecular oxygen ($O_2$).

As shown in FIGS. 2–5, for example, at the termination of the formation of the low K first dielectric layer 105, formed by being blanket-deposited by a plasma-enhanced chemical vapor deposition (PECVD), using a precursor such as monomethyl silane ($SiH_3(CH_3)$), dimethyl silane ($SiH_2(CH_3)_2$), trimethyl silane ($SiH(CH_3)_3$), or tetramethyl silane ($Si(CH_3)_4$), the deposition conditions may be gradually changed from those used to form a low K carbon-containing film to those used to form a standard oxide layer having substantially no carbon (C). This transition may be accomplished by stages to form a graded transition from the low K carbon-containing film to the standard oxide layer having substantially no carbon (C). The grading of the graded transition may involve lowering the flow of the precursor such as monomethyl silane ($SiH_3(CH_3)$), dimethyl silane ($SiH_2(CH_3)_2$), trimethyl silane ($SiH(CH_3)_3$), or tetramethyl silane ($Si(CH_3)_4$), raising the flow of an oxidant such as nitrous oxide ($N_2O$) and/or molecular oxygen ($O_2$), and raising the flow of some helium (He).

Figure 2:
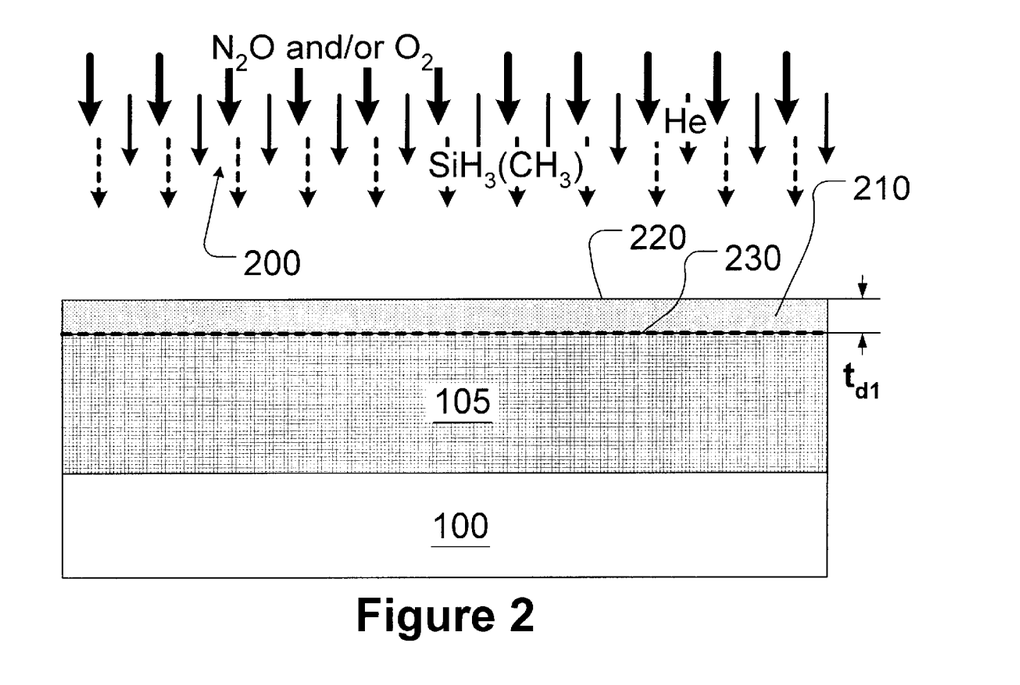
FIG. 2 schematically illustrates grading upper portions of the first dielectric layer by reducing a flow of monomethyl silane; increasing a flow of the helium (He) and increasing a flow of the at least one of nitrous oxide ($N_2O$) and molecular nitrogen ($O_2$), according to various embodiments of the present invention.

As shown in FIG. 2, the upper portion 210 of the first dielectric layer 105 may be graded using monomethyl silane ($SiH_3(CH_3)$), with helium (He) and at least one of nitrous oxide ($N_2O$) and/or molecular oxygen ($O_2$), as indicated schematically by the arrows 200. The grading of the upper portion 210 of the first dielectric layer 105 comprises reducing the flow of the monomethyl silane ($SiH_3(CH_3)$), increasing the flow of the helium (He), and increasing the flow of the nitrous oxide ($N_2O$) and/or the molecular oxygen ($O_2$). The upper portion 210 is bounded above, by an upper surface 220, and below, as shown by phantom line 230. The upper portion 210 of the first dielectric layer 105 may have a thickness $t_{d1}$ in a range of about 100–1000 Å, for example.

Figure 3:
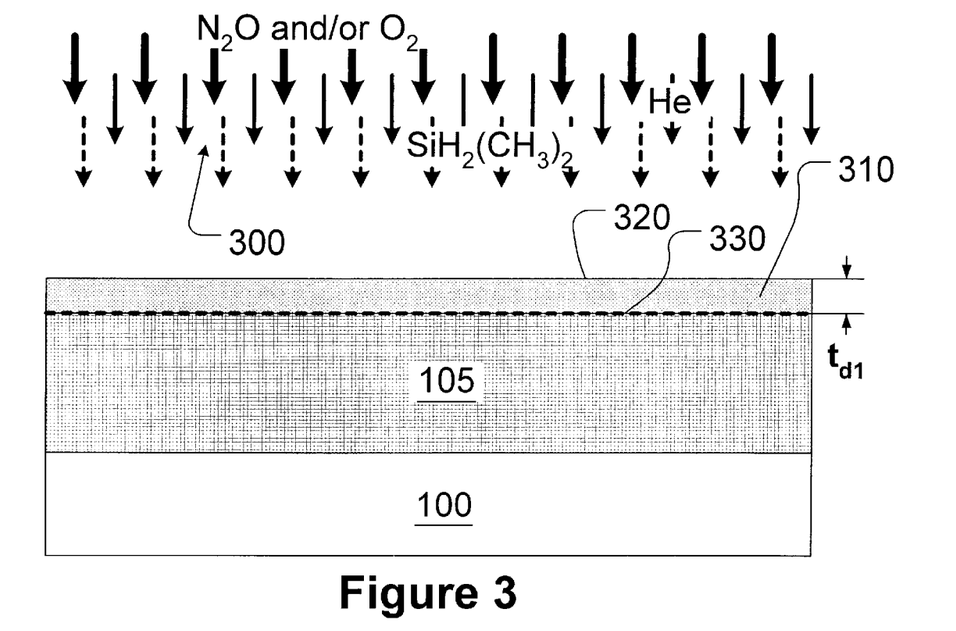
FIG. 3 schematically illustrates grading upper portions of the first dielectric layer by reducing a flow of dimethyl silane, increasing a flow of the helium (He) and increasing a flow of the at least one of nitrous oxide ($N_2O$) and molecular nitrogen ($O_2$), according to various embodiments of the present invention.

As shown in FIG. 3, the upper portion 310 of the first dielectric layer 105 may be graded using dimethyl silane ($SiH_2(CH_3)_2$), with helium (He) and at least one of nitrous oxide ($N_2O$) and/or molecular oxygen ($O_2$), as indicated schematically by the arrows 300. The grading of the upper portion 310 of the first dielectric layer 105 comprises reducing the flow of the dimethyl silane ($SiH_2(CH_3)_2$), increasing the flow of the helium (He), and increasing the flow of the nitrous oxide ($N_2O$) and/or the molecular oxygen ($O_2$). The upper portion 310 is bounded above, by an upper surface 320, and below, as shown by phantom line 330. The upper portion 310 of the first dielectric layer 105 may have a thickness $t_{d1}$ in a range of about 100–1000 Å, for example.

Figure 4:
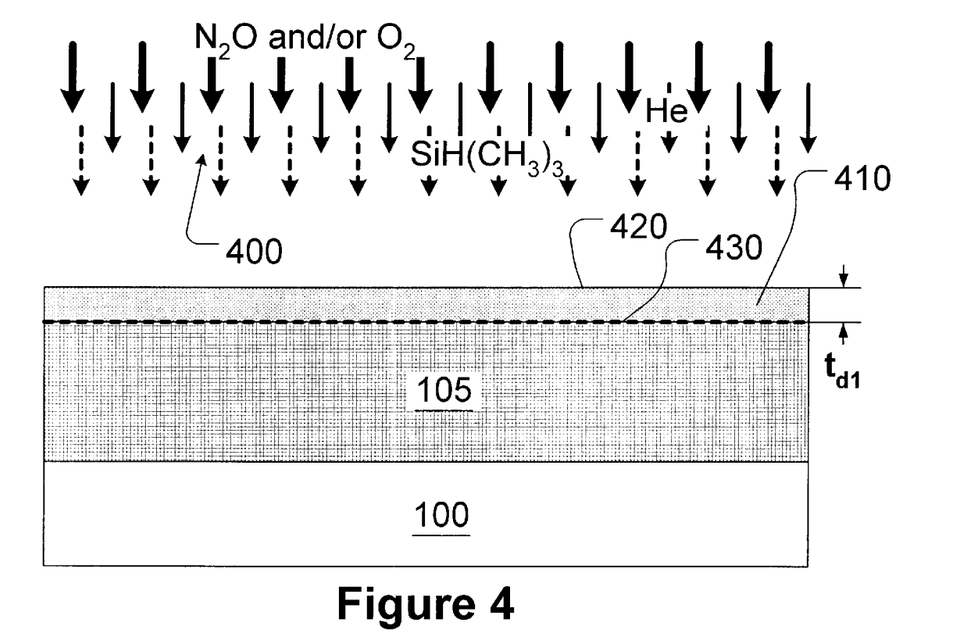
FIG. 4 schematically illustrates grading upper portions of the first dielectric layer by reducing a flow of trimethyl silane, increasing a flow of the helium (He) and increasing a flow of the at least one of nitrous oxide ($N_2O$) and molecular nitrogen ($O_2$), according to various embodiments of the present invention.

As shown in FIG. 4, the upper portion 410 of the first dielectric layer 105 may be graded using trimethyl silane ($SiH(CH_3)_3$), with helium (He) and at least one of nitrous oxide ($N_2O$) and/or molecular oxygen ($O_2$), as indicated schematically by the arrows 400. The grading of the upper portion 410 of the first dielectric layer 105 comprises reducing the flow of the trimethyl silane ($SiH(CH_3)_3$), increasing the flow of the helium (He), and increasing the flow of the nitrous oxide ($N_2O$) and/or the molecular oxygen ($O_2$). The upper portion 410 is bounded above, by an upper surface 420, and below, as shown by phantom line 430. The upper portion 410 of the first dielectric layer 105 may have a thickness $t_{d1}$ in a range of about 100–1000 Å, for example.

Figure 5:
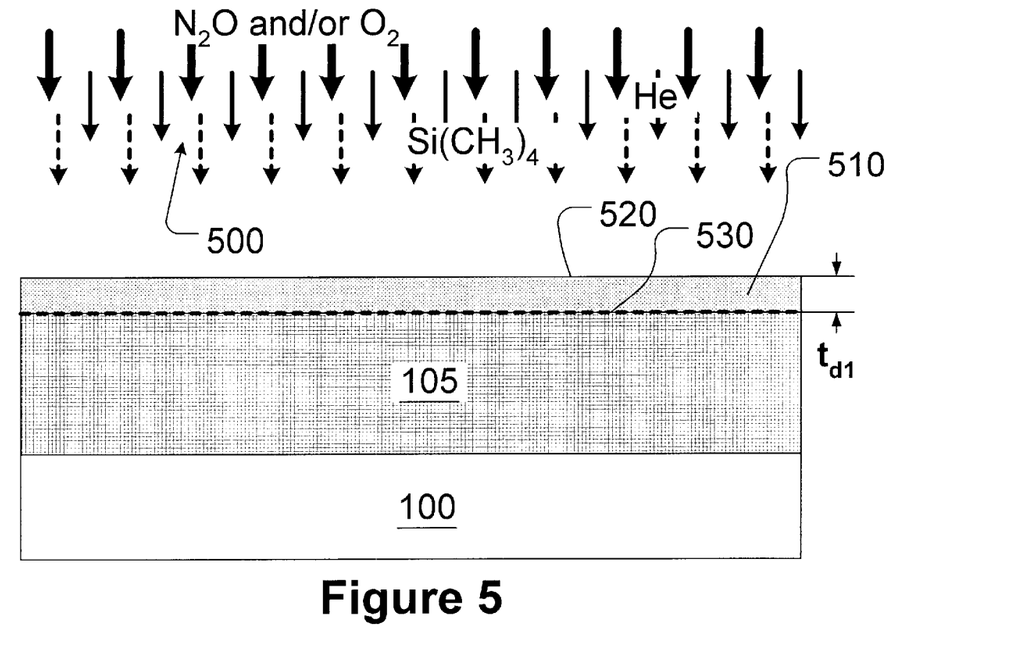
FIG. 5 schematically illustrates grading upper portions of the first dielectric layer by reducing a flow of tetramethyl silane, increasing a flow of the helium (He) and increasing a flow of the at least one of nitrous oxide ($N_2O$) and molecular nitrogen ($O_2$), according to various embodiments of the present invention.

As shown in FIG. 5, the upper portion 510 of the first dielectric layer 105 may be graded using tetramethyl silane ($Si(CH_3)_4$), with helium (He) and at least one of nitrous oxide ($N_2O$) and/or molecular oxygen ($O_2$), as indicated schematically by the arrows 500. The grading of the upper portion 510 of the first dielectric layer 105 comprises reducing the flow of the tetramethyl silane ($Si(CH_3)_4$), increasing the flow of the helium (He), and increasing the flow of the nitrous oxide ($N_2O$) and/or the molecular oxygen ($O_2$). The upper portion 510 is bounded above, by an upper surface 520, and below, as shown by phantom line 530. The upper portion 510 of the first dielectric layer 105 may have a thickness $t_{d1}$ in a range of about 100–1000 Å, for example.

Figure 6:
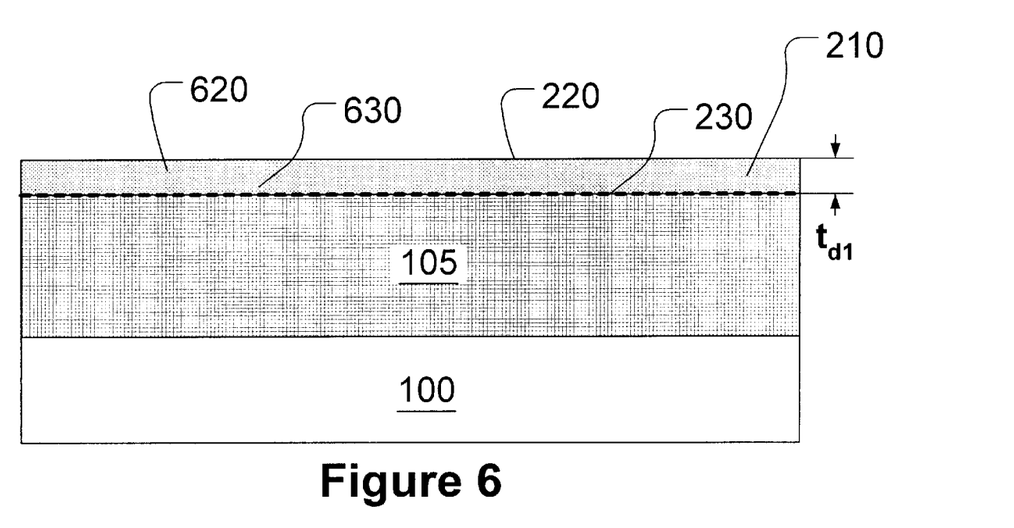
FIG. 6 schematically illustrates upper portions of the graded first dielectric layer following the grading, according to various alternative embodiments of the present invention.

FIG. 6 schematically illustrates upper portions of the graded first dielectric layer following the grading, according to various alternative embodiments of the present invention;

As shown in FIG. 6, the upper portion 210 of the first dielectric layer 105 is schematically illustrated following the grading as described above. As shown in FIG. 6, the graded upper portion 210 has a graded transition from a lower carbon-containing portion 630, substantially adjacent the phantom line 230, to an upper oxide portion 620, substantially adjacent the upper surface 220, having substantially no carbon (C).

Figure 7:
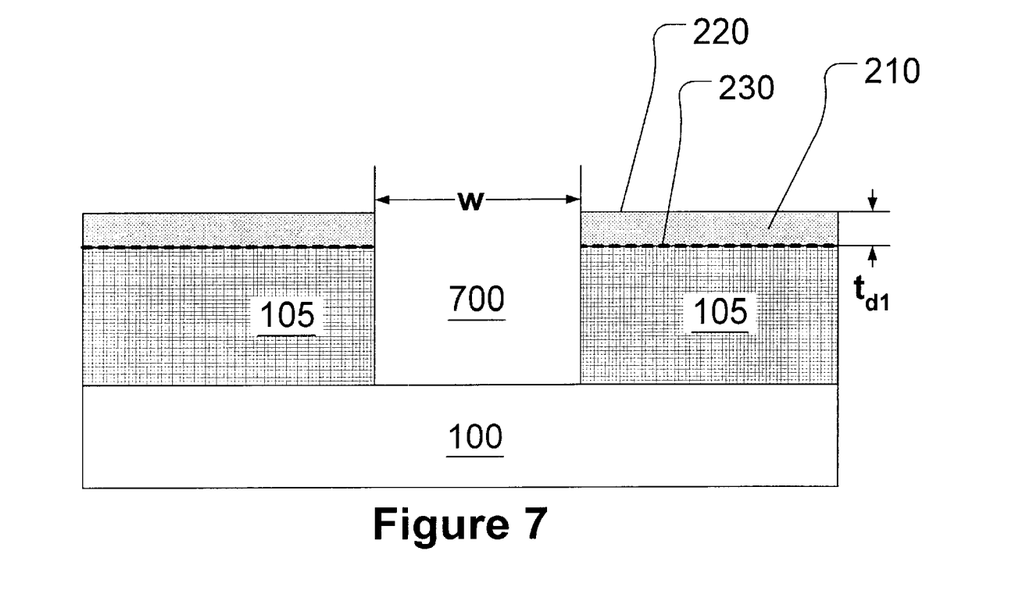
FIG. 7 schematically illustrates an opening formed in the graded first dielectric layer according to various embodiments of the present invention.

As shown in FIG. 7, an opening 700 is formed in the first dielectric layer 105. The opening 700 may be formed for conductive metal lines, contact holes, via holes, and the like, and may be etched into the first dielectric layer 105. The opening 700 may have a width w that may be in a range of about 1000–5000 Å, for example. The opening 700 may be formed by using a variety of known anisotropic etching techniques, such as a reactive ion etching (RIE) process using hydrogen bromide (HBr) and argon (Ar) as the etchant gases, for example. Alternatively, a reactive ion etching (RIE) process with trifluoromethane or fluoroform ($CHF_3$) and argon (Ar) as the etchant gases may be used, for example. Plasma etching may also be used in various illustrative embodiments.

Figure 8:
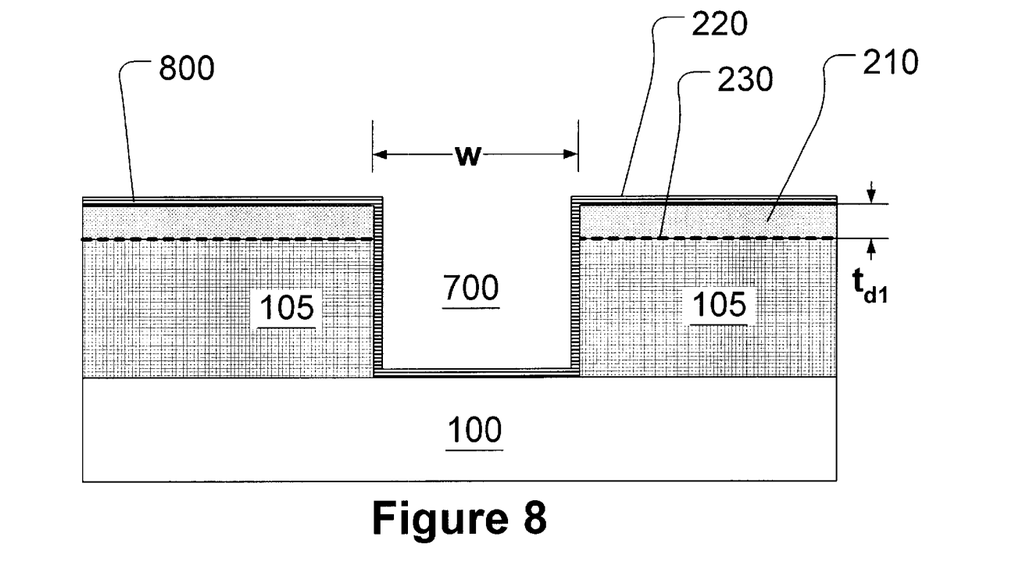
FIG. 8 schematically illustrates a barrier metal layer formed in the opening and above the first dielectric layer according to various embodiments of the present invention.
Figure 9:
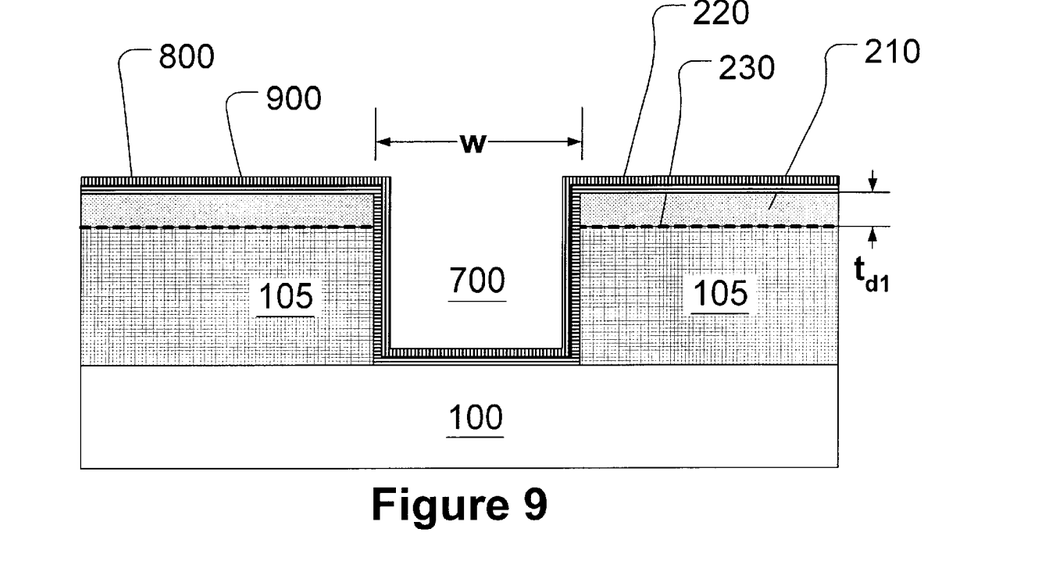
FIG. 9 schematically illustrates a copper seed layer formed adjacent the barrier metal layer according to various embodiments of the present invention.

As shown in FIGS. 8 and 9, a thin barrier metal layer of tantalum (Ta) 800 and a copper (Cu) seed layer 900 (or a seed layer of another conductive material) are applied to the entire surface using vapor-phase deposition. The barrier metal layer 800 and the copper (Cu) seed layer 900 blanket-deposit the first dielectric layer 105 and the opening 700. The barrier metal layer 800 may be formed of at least one layer of a barrier metal material, such as tantalum or tantalum nitride, and the like. For example, the barrier metal layer 800 may also be formed of titanium nitride, titanium-tungsten, nitrided titanium-tungsten, magnesium, or another suitable barrier material. The copper seed layer 900 may be formed on top of the one or more barrier metal layers 800 by physical vapor deposition (PVD) or chemical vapor deposition (CVD), for example.

Figure 10:
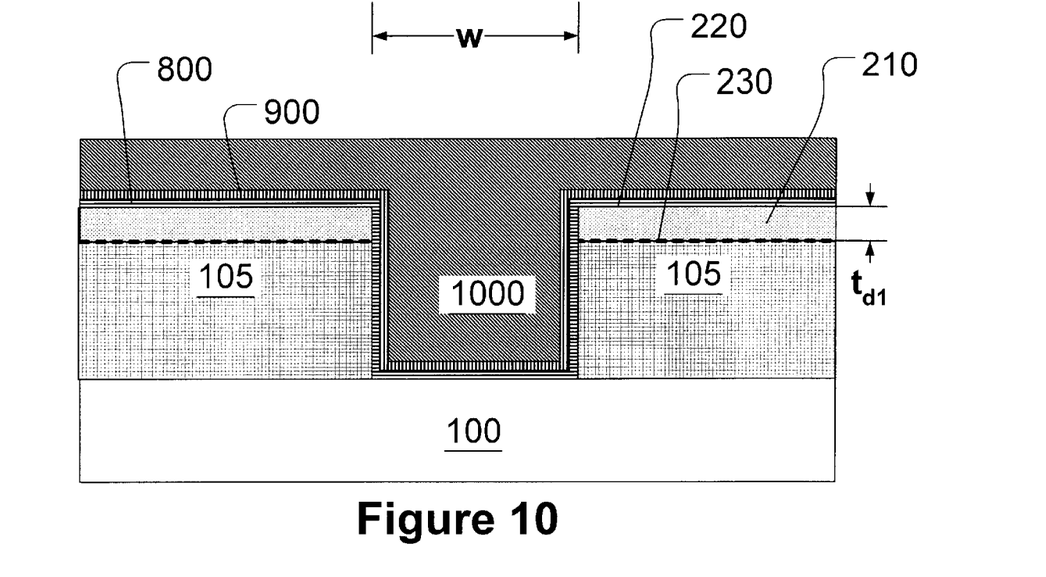
FIG. 10 schematically illustrates a copper layer formed adjacent the copper seed layer according to various embodiments of the present invention.

As shown in FIG. 10, the bulk of the copper trench-fill (or trench-fill of another conductive material) is frequently done using an electroplating technique, where the conductive surface comprising the one or more barrier metal layers 800 and the copper seed layer 900 may be mechanically clamped to an electrode (not shown) to establish an electrical contact, and the structure layer 100 is then immersed in an electrolyte solution containing copper (Cu) ions (or ions of another conductive material). An electrical current is then passed through the wafer-electrolyte system to cause reduction and deposition of copper (Cu) atoms (or atoms of another conductive material) on the copper seed layer 900. In addition, an alternating-current bias of the wafer-electrolyte system has been considered as a method of self-planarizing the deposited copper (Cu) film (or film of another conductive material), similar to the deposit-etch cycling used in high-density plasma (HDP) tetraethyl orthosilicate (TEOS) dielectric depositions.

Figure 11:
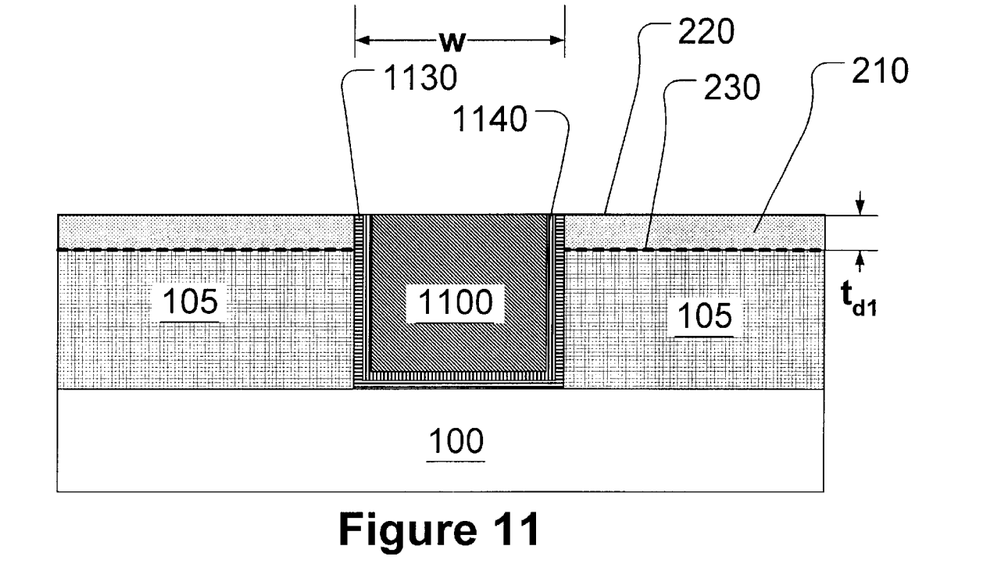
FIG. 11 schematically illustrates planarization of the copper layer and removal of the copper layer, copper seed layer and barrier metal layer outside of the opening according to various embodiments of the present invention.

As shown in FIG. 10, this process typically produces a planar coating of copper (Cu) 1000 (or another conductive material) of substantially constant thickness above the first dielectric layer 105, being thicker, of course, where the opening 700 (FIGS. 7–4) had been. As shown in FIG. 11, once a sufficiently thick layer of copper (Cu) 1000 has been deposited, the layer of copper (Cu) 1000 may be planarized using chemical mechanical planarization (CMP) techniques. The planarization using chemical mechanical planarization (CMP) clears all copper (Cu) and barrier metal from above the first dielectric layer 105, leaving a copper (Cu) structure 1100, such as a copper-filled via and/or trench, forming a portion of a copper-interconnect, adjacent remaining portions 1130 and 1140 of the one or more barrier metal layers 800 and copper seed layer 900, respectively, as shown in FIG. 11.

Figure 12:
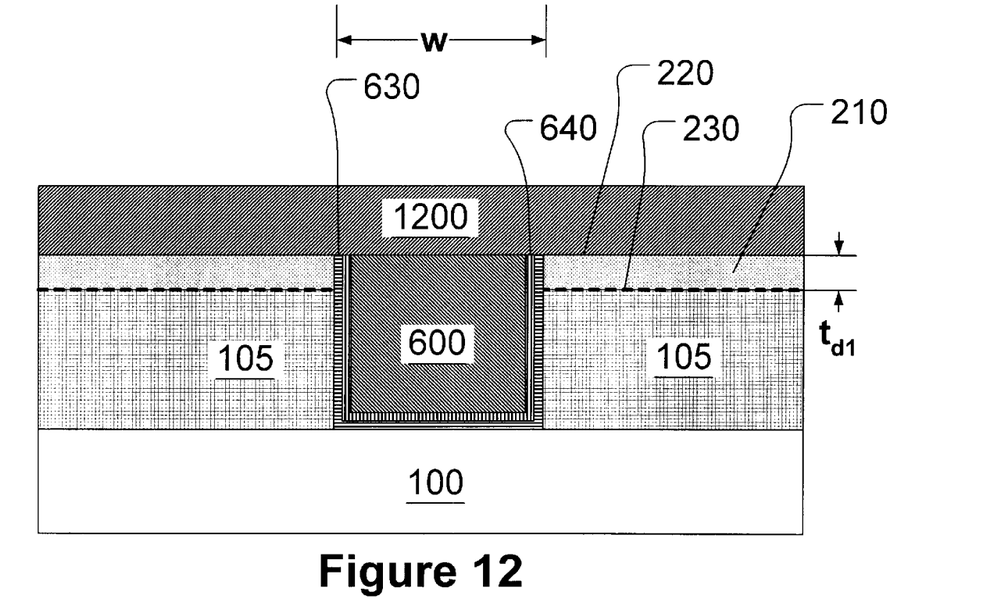
FIG. 12 schematically illustrates a second dielectric layer formed above the first dielectric layer and the copper structure according to various embodiments of the present invention.

As shown in FIG. 12, a second dielectric layer 1200 is formed above the first dielectric layer 105 and above the copper (Cu) structure 1100. The second dielectric layer 1200 may be a diffusion barrier layer and/or an etch stop layer (typically formed of silicon nitride, $Si_3N_4$, or SiN, for short). The second dielectric layer 1200 may be formed by a variety of known techniques for forming such layers, e.g., chemical vapor deposition (CVD), low-pressure chemical vapor deposition (LPCVD), plasma-enhanced chemical vapor deposition (PECVD), and the like, and may have a thickness ranging from approximately 100 Å–1000 Å, for example.

Any of the above-disclosed embodiments of a method of forming a portion of a copper interconnect enables a copper interconnect to be formed using conventional damascene techniques in conjunction with treated low K dielectric materials that are far more robust than the conventional low K materials typically used in conventional damascene techniques. By forming a treated low K dielectric layer adjacent the copper interconnect, all of the advantages of using a low K dielectric layer to reduce the capacitance and RC delays between adjacent copper interconnects are retained, without any of the difficulties of forming the copper interconnect using a conventional untreated low K dielectric during the conventional damascene processing.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed:

1. A method comprising:

forming a first dielectric layer above a structure layer, the first dielectric layer having an upper portion; and grading the upper portion of the first dielectric layer using at least one of monomethyl silane, dimethyl silane, trimethyl silane, and tetramethyl silane with helium (He) and at least one of nitrous oxide (N₂O) and molecular oxygen (O₂).

2. The method of claim 1, further comprising:

forming an opening in the first dielectric layer; and forming a copper structure in the opening.

3. The method of claim 2, further comprising:

forming a second dielectric layer above the first dielectric layer and the copper structure.

4. The method of claim 1, wherein forming the first dielectric layer comprises forming the first dielectric layer using a low dielectric constant (low K) dielectric organosilicate glass (OSG) material, having a dielectric constant K of at most about four.

5. The method of claim 1, wherein forming the first dielectric layer comprises forming the first dielectric layer using plasma-enhanced chemical vapor deposition (PECVD).

6. The method of claim 1, wherein grading the upper portion of the first dielectric layer comprises reducing a flow of the at least one of monomethyl silane, dimethyl silane, trimethyl silane, and tetramethyl silane, increasing a flow of the helium (He) and increasing a flow of the at least one of nitrous oxide (N₂O) and molecular oxygen (O₂).

7. The method of claim 2, wherein grading the upper portion of the first dielectric layer comprises reducing a flow of the at least one of monomethyl silane, dimethyl silane, trimethyl silane, and tetramethyl silane, increasing a flow of the helium (He) and increasing a flow of the at least one of nitrous oxide (N₂O) and molecular oxygen (O₂).

8. The method of claim 3, wherein grading the upper portion of the first dielectric layer comprises reducing a flow of the at least one of monomethyl silane, dimethyl silane, trimethyl silane, and tetramethyl silane, increasing a flow of the helium (He) and increasing a flow of the at least one of nitrous oxide (N₂O) and molecular oxygen (O₂).

9. The method of claim 4, wherein grading the upper portion of the first dielectric layer comprises reducing a flow of the at least one of monomethyl silane, dimethyl silane, trimethyl silane, and tetramethyl silane, increasing a flow of the helium (He) and increasing a flow of the at least one of nitrous oxide (N₂O) and molecular oxygen (O₂).

10. The method of claim 5, wherein grading the upper portion of the first dielectric layer comprises reducing a flow of the at least one of monomethyl silane, dimethyl silane, trimethyl silane, and tetramethyl silane, increasing a flow of the helium (He) and increasing a flow of the at least one of nitrous oxide (N₂O) and molecular oxygen (O₂).

11. A method comprising:

forming a first dielectric layer above a structure layer using a low dielectric constant (low K) dielectric organosilicate glass (OSG) material, having a dielectric constant K of at most about four, using plasma-enchanced chemical vapor deposition (PECVD), the first dielectric layer having an upper portion;

grading the upper portion of the first dielectric layer using at least one of monomethyl silane, dimethyl silane, trimethyl silane, and tetramethyl silane with helium (He) and at least one of nitrous oxide (N₂O) and molecular oxygen (O₂); and forming an opening in the first dielectric layer.

12. The method of claim 11, further comprising:

forming at least one metal barrier layer and a copper seed layer in the opening, the copper seed layer formed above and adjacent the at least one metal barrier layer; and forming a copper structure in the opening, the copper structure formed above and adjacent the copper seed layer.

13. The method of claim 12, further comprising:

forming a second dielectric layer above the first dielectric layer and the copper structure, using plasma-enhanced chemical vapor deposition (PECVD) of an oxide.

14. The method of claim 11, wherein grading the upper portion of the first dielectric layer comprises reducing a flow of the at least one of monomethyl silane, dimethyl silane, trimethyl silane, and tetramethyl silane, increasing a flow of the helium (He) and increasing a flow of the at least one of nitrous oxide (N₂O) and molecular oxygen (O₂).

15. The method of claim 12, wherein grading the upper portion of the first dielectric layer comprises reducing a flow of the at least one of monomethyl silane, dimethyl silane, trimethyl silane, and tetramethyl silane, increasing a flow of the helium (He) and increasing a flow of the at least one of nitrous oxide (N₂O) and molecular oxygen (O₂).

16. The method of claim 13, wherein grading the upper portion of the first dielectric layer comprises reducing a flow of the at least one of monomethyl silane, dimethyl silane, trimethyl silane, and tetramethyl silane, increasing a flow of the helium (He) and increasing a flow of the at least one of nitrous oxide (N₂O) and molecular oxygen (O₂).

* * * * *